United States Patent [19]
Farrow

[11] Patent Number: 5,906,902
[45] Date of Patent: May 25, 1999

[54] MANUFACTURING SYSTEM ERROR DETECTION

[75] Inventor: Reginald Conway Farrow, East Brunswick, N.J.

[73] Assignee: Lucent Technologies Inc., Murray Hill, N.J.

[21] Appl. No.: 08/806,301

[22] Filed: Feb. 26, 1997

Related U.S. Application Data

[63] Continuation of application No. 08/201,866, Feb. 25, 1994.

[51] Int. Cl.$^6$ .................................................. G03C 5/00
[52] U.S. Cl. ............................. 430/30; 430/394; 430/296
[58] Field of Search ................................. 430/30, 5, 394, 430/296

[56] References Cited

U.S. PATENT DOCUMENTS

| | | | |
|---|---|---|---|
| 4,431,923 | 2/1984 | Wang et al. | 250/491.1 |
| 4,513,203 | 4/1985 | Bohlen et al. | 250/491.1 |
| 4,564,764 | 1/1986 | Yasuda et al. | 250/491.1 |
| 4,590,382 | 5/1986 | Tabata | 250/491.1 |
| 4,742,923 | 5/1988 | Kuyel | 250/491.1 |
| 4,757,207 | 7/1988 | Chappelow et al. | 250/491.1 |
| 4,929,083 | 5/1990 | Brunner . | |
| 4,971,444 | 11/1990 | Kato | 356/375 |
| 5,040,228 | 8/1991 | Bose et al. | 382/8 |
| 5,074,667 | 12/1991 | Miyatake | 356/401 |
| 5,079,112 | 1/1992 | Berger et al. | 430/4 |
| 5,087,537 | 2/1992 | Conway et al. | 430/15 |
| 5,130,213 | 7/1992 | Berger et al. | 430/4 |
| 5,153,678 | 10/1992 | Ota | 356/401 |
| 5,160,845 | 11/1992 | Stumbo et al. | 250/491.1 |
| 5,279,925 | 1/1994 | Berger et al. | 430/5 |
| 5,521,036 | 5/1996 | Iwamoto et al. | 430/5 |

FOREIGN PATENT DOCUMENTS

A-0 130 691  1/1985  European Pat. Off. .
A-0 170 013  2/1986  European Pat. Off. .

OTHER PUBLICATIONS

S. D. Berger et al., "Projection Electron–Beam Lithography: A New Approach," *J. Vac. Sci. Technol.*, B9 (6), Nov./Dec. 1991, pp. 2996–2999.

R. C. Farrow et al., "Mark Detection for Alignment and Registration in a High–Throughput Projection Electron Lithography Tool," *J. Vac. Sci. Technol.*, B10 (6), Nov./Dec. 1992, pp. 2780–2783.

R. C. Farrow et al., "Alignment and Registration Schemes for Projection Electron Lithography," *J. Vac. Sci. Technol.*, B9 (6), Nov./Dec. 1991, pp. 3582–3585.

*Primary Examiner*—Maria Nuzzolillo
*Assistant Examiner*—Laura Weiner

[57] ABSTRACT

The present invention relates to a method for determining error in a manufacturing system by providing a substrate having first pattern disposed thereon. An energy source such as electromagnetic radiation or particle beams is projected through a shaping member having a second pattern incongruent with the first pattern to form a shaped energy source. The shaped energy source impinges on the first pattern such that a portion of said shaped energy source is reflected, scattered, or transmitted by the first pattern. The portion of the shaped energy source that is reflected, scattered or transmitted by the first pattern is detected to determine the presence or absence of an error in the manufacturing system.

In a further aspect, the present invention relates to a method for constructing an error detection system. A waveform representative of at least one manufacturing system parameter is selected. Associated with the waveform is a mathematical function. The function is expanded in a set of orthogonal functions to yield coefficients which are used to construct an error detection pattern.

12 Claims, 6 Drawing Sheets

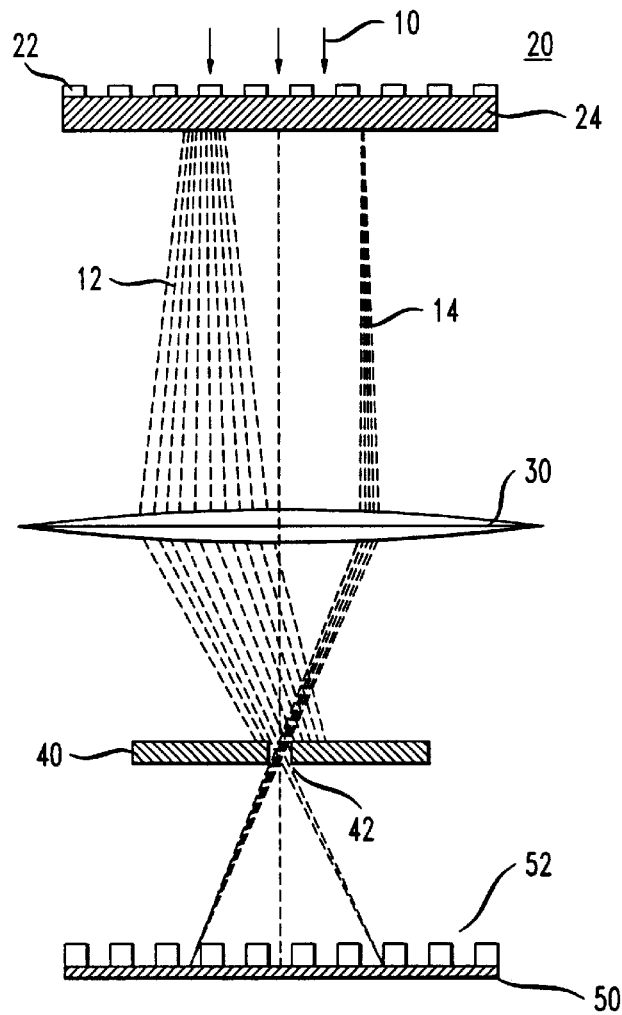
FIG. 1
FIG. 2
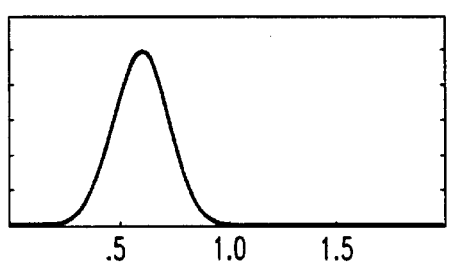
FIG. 3
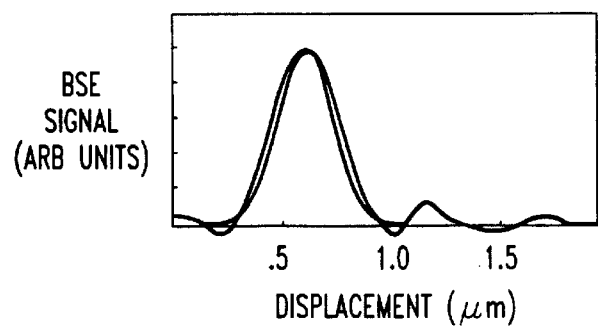

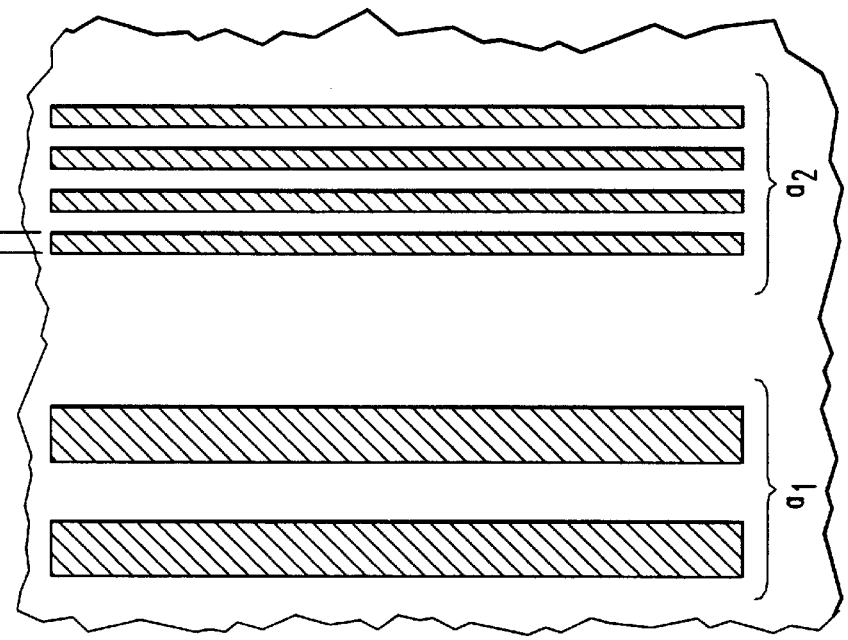
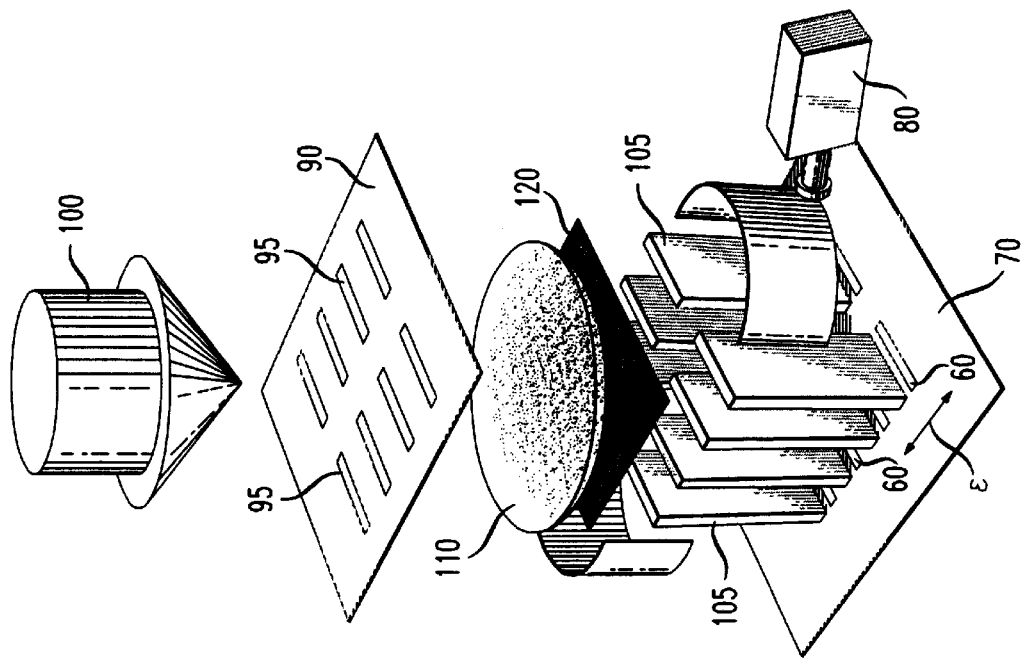

MANUFACTURING SYSTEM ERROR DETECTION

This application is a continuation of application Ser. No. 08/201,866, filed on Feb. 25, 1994

BACKGROUND OF THE INVENTION

1. Field of the Invention

The invention relates to a method for determining errors in manufacturing systems, especially errors of relative alignment between various elements in a manufacturing system. The invention further relates to a method for constructing an error detection system. The method of the present invention finds application in lithography systems where errors involving mask alignment, focus, magnification, etc. may be determined. Another aspect of the invention relates to a feedback control loop for sensing an error in a lithography system, determining the cause(s) of the error, and correcting the cause(s) of the error.

2. Description of the Related Art a. SCALPEL lithography

FIG. 1 schematically depicts a SCALPEL (SCattering with Angular Limitation in Projection Electron Lithography) process. In general, the SCALPEL approach employs the principle of electron scattering to delineate circuit patterns on substrates. A mask 20 is used to shape an electron beam source. Mask 20 includes electron transmissive regions 22 and 24 having different electron scattering properties. Region 22 is a pattern of high electron scattering material examples of which include high atomic number metals such as gold and tungsten. Region 24 is a low electron scattering material, for example, a low atomic number element or compound such as silicon or silicon nitride formed into a membrane.

As electron beam 10 traverses the mask, electrons are scattered, the amount and angle of scattering being a function of the atomic number of the constituent atoms in the material. As a result of the differential scattering properties of the mask, an angular distribution of electrons is formed at the exit surface of the mask. Those electrons 12 having passed through patterned region 22 of high atomic weight material are generally scattered to a higher angle than those electrons 14 which passed only through the low atomic number membrane region 24.

The scattered electrons 12 and 14 pass into projection lens system 30 which demagnifies the image formed by the scattered electrons. In the back focal plane of the projecting lens system, the electrons are distributed by their angle of scatter. A filter 40 having an aperture 42 is placed in the back focal plane to angularly select electrons which will form the ultimate image. If aperture 42 is sufficiently small and on the focal axis, only those electrons scattered through small angles will contribute to the final image 52 on substrate 50. The electrons scattered through small angles 12, i.e., electrons which passed through the low atomic number membrane regions 24, are the electrons which interact with a substrate material, such as a resist, to create a latent image. For a given mask and optical system, the contrast in the image is determined by the size of the angularly limiting aperture.

SCALPEL lithography is further described in Berger et al., *J. Vac. Sci. Technol.*, B9, November/December 1991, pp. 2996–2999 and U.S. Pat. Nos. 5,079,112 and 5,130,213, the disclosures of which are incorporated by reference herein.

b. System Errors

In SCALPEL lithography, as in numerous other manufacturing operations, the relationship of the various system components to one another is important to the success of the resultant process. During the printing process, the image of features on the mask must be precisely aligned with wafer features that are present from previous levels of processing. The allowable error for level-to-level overlay is by convention less than ⅓ of the minimum feature size and combines alignment error with errors from other machine and process effects. Among these other errors are optical errors, e.g., focus, magnification, astigmatism, that need to be monitored and minimized during wafer exposure. For submicron features, alignment of the mask image and substrate features must be extremely precise, in the range of nanometers.

One approach to the problem of system alignment for SCALPEL lithography involves scanning the demagnified image of a mask feature over an identically-shaped mark that is fabricated on a wafer and measuring the intensity of electrons which are backscattered by the substrate mark. The substrate marks are fabricated from a material having a higher backscatter coefficient than the surrounding substrate material. An example is to use mask features and wafer marks consisting of identical lines and spaces as described in Farrow et al., *J. Vac. Sci. Technol. B*, 10(6) November/December 1992, pp. 2780–2783, the disclosure of which is incorporated by reference herein. An extremum of backscattered electron intensity occurs at the point where a beam of electrons formed by the mask feature is exactly aligned with lines on the substrate. In this position, the mask image is correctly aligned with the substrate.

While the above-described method provides a useful alignment technique, during mark detection it is desirable to generate a signal that is particularly suited for the derivation of specific information whether it be alignment or other system conditions such as focus and magnification. In the above-described mark detection method the signal is a function of the overlap between the mask image and the wafer mark. Therefore, the mark pattern geometry determines the intensity profile of the signal and likewise the suitability for specific information requirements. Intensity profile refers to the measured signal intensity, e.g., backscattered electron or other signal, as a function of the adjustable parameter, e.g., relative alignment.

Thus, there is a need in the art for a precise error detection system to determine various sources of system error resulting, e.g., from misalignment or misadjustment of various manufacturing system components. There is a further need in the art for an error detection system which generates a signal explicitly constructed to yield specific information concerning various system parameters.

SUMMARY OF THE INVENTION

The present invention relates to a method for determining error in a manufacturing system by providing a substrate having first pattern disposed thereon. An energy source such as electromagnetic radiation or particle beams is projected through a shaping member having a second pattern incongruent with the first pattern to form a shaped energy source. The term "energy source," as used herein, refers to the actual radiation or particle beam itself, as opposed to the generator of the radiation or particle beam (e.g., an electron gun). The shaped energy source impinges on the first pattern such that a portion of said shaped energy source is reflected, scattered, or transmitted by the first pattern. The portion of the shaped energy source that is reflected, scattered or transmitted by the first pattern is detected to determine the presence or absence of an error in the manufacturing system.

In a further aspect, the present invention relates to a method for constructing an error detection system. A waveform representative of at least one manufacturing system parameter is selected. Associated with the waveform is a mathematical function. The function is expanded in a set of orthogonal functions to yield coefficients which are used to construct an error detection pattern.

BRIEF DESCRIPTION OF THE DRAWINGS

FIG. 1 is a schematic representation of a SCALPEL lithography system.

FIG. 2 is an ideal error detection signal for use in mask alignment in a SCALPEL lithography system.

FIG. 3 is a calculated error detection signal created by using a mark pattern generated according to the present invention.

FIG. 4 illustrates a mark detection system for SCALPEL lithography.

FIG. 7 is an enlarged portion of the mask pattern of FIG. 5 taken at VII.

DETAILED DESCRIPTION

Figure 5:
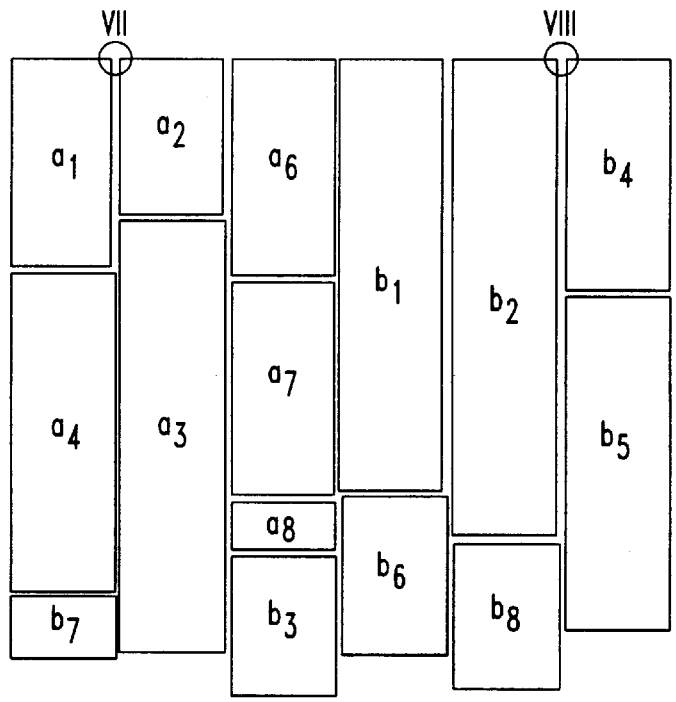
FIG. 5 schematically illustrates a demagnified mask pattern showing subpatterns $a_1$–$a_8$ and $b_1$–$b_8$.

Turning now to the drawings in detail, embodiments of the present invention are described with reference to the determination of mask and substrate alignment in a SCALPEL lithography system. Although embodiments of the invention are discussed in the SCALPEL mask alignment context, it is understood that the processes described herein may be applied to the determination of other SCALPEL system errors including, but not limited to, focus, magnification, and rotational alignment errors. Further, the interaction of an energy source with mismatched substrate and energy-shaping patterns may be used to determine the existence of a system error or errors in any manufacturing system in which electromagnetic radiation or a particle beam can impinge on a substrate or other workpiece after being shaped by a energy-shaping pattern.

The present invention, when applied to mask alignment error in a SCALPEL lithography system, measures a signal from which is derived information concerning positional alignment. A signal is selected, the waveform of which yields the desired system information. For example, a signal having a Guassian waveform with an extremum offset from the origin is used to determine positional alignment in a single direction for a SCALPEL mask/substrate system. Such a signal is illustrated in FIG. 2.

Once a desired signal is chosen, a mathematical function is used to represent the signal and the marks for shaping an energy source and substrate marks for interacting with the energy source are constructed accordingly. The mark system construction begins with expanding the required mathematical function in a set of orthogonal functions. Exemplary functions include sines and cosines used in a trigonometric Fourier series expansion or another complete set of orthogonal functions such as Fourier-Bessel series. When the trigonometric Fourier series method is used, a set of functions are employed, the terms of which are composed from the signals generated by the interaction of a patterned energy source with a substrate mark pattern of geometrical elements such as lines and spaces. Each term in the series expansion is represented by a line and space subpattern region within the substrate mark pattern.

As a portion of the patterned energy source is scanned over a substrate line and space subpattern, energy is measured which is scattered, transmitted, reflected, or absorbed as a result of the interaction of the patterned energy source with the line and space subpattern. This measured energy forms a signal, with the signal from each of the subpatterns combining to create the overall desired signal of the selected waveform and its periodic extension.

The periodicity of the signal is chosen to be greater than the capture range of the system elements of interest. The expression "capture range" denotes the extent of a region in which gross adjustment or alignment of the system can be performed, i.e., the precisely adjusted or aligned position is within the capture range. Therefore, within the capture range, a single unique waveform of the signal will be measured.

An example of a signal desired to be generated in the error detection system of the present invention as applied to SCALPEL lithography is illustrated in FIG. 2. This signal is suited to the detection of mask/substrate misalignment in a single direction. An exemplary function is:

$$r(x) = \exp\left[-\frac{1}{2}\left(\frac{x-\delta}{\sigma}\right)^2\right]$$

where $\delta\equiv$ peak offset from 0;
$\sigma\equiv$ a half width of the Gaussian;
For the waveform shown in FIG. 2:
$\sigma=0.125$
$\delta=0.6$
The coefficients for the sinusoidal components of the Fourier series expansion of this function are:

$$a_i = \frac{1}{L}\int_0^{2L} r(x) \cos\left(\frac{i\pi x}{L}\right) dx$$

$$b_n = \frac{1}{L}\int_0^{2L} r(x) \sin\left(\frac{n\pi x}{L}\right) dx$$

where L=width of the widest substrate mark
x=integration parameter
Solving the above equation yields Fourier coefficients shown in TABLE 1 below (first eight terms):

TABLE 1

| $a_n$ | value | $b_n$ | value |
|---|---|---|---|
| $a_1$ | 0.09033 | $b_1$ | 0.12432 |
| $a_2$ | −0.04482 | $b_2$ | 0.13794 |

TABLE 1-continued

| $a_n$ | value | $b_n$ | value |
|---|---|---|---|
| $a_3$ | −0.12527 | $b_3$ | 0.0407 |
| $a_4$ | −0.09311 | $b_4$ | −0.06765 |
| $a_5$ | 9.46143 × $10^{-7}$ | $b_5$ | −0.09676 |
| $a_6$ | 0.06332 | $b_6$ | −0.046 |
| $a_7$ | 0.05794 | $b_7$ | 0.01883 |
| $a_8$ | 0.0141 | $b_8$ | 0.04339 |

TABLE 2 lists these coefficients normalized over the summation of the absolute value of the coefficients, i.e., $$nm = \sum_{j=1}^{n}(|a_j|+|b_j|).$$

TABLE 2

| $a_j$ nm | value | $b_j$ nm | value |
|---|---|---|---|
| $a_1$ | 0.07742 | $b_1$ | 0.10656 |
| $a_2$ | −0.03842 | $b_2$ | 0.11823 |
| $a_3$ | −0.10737 | $b_3$ | 0.03488 |
| $a_4$ | −0.0798 | $b_4$ | −0.05798 |
| $a_5$ | 8.10949 × $10^{-7}$ | $b_5$ | −0.08293 |
| $a_6$ | 0.05427 | $b_6$ | −0.03943 |
| $a_7$ | 0.04966 | $b_7$ | 0.01614 |
| $a_8$ | 0.01208 | $b_8$ | 0.03719 |

The width, L, of the first line and space subpattern (n=1) will determine the period of the derived signal intensity and will correspond to the first term in the series expansion. Each successive term (n=2, 3, 4 . . . ) in the expansion will require line and space subpatterns that have integral decreasing widths given by n/L. The limit to the expansion is determined by the smallest feature that can be processed.

The function graphically illustrated in FIG. 2 can be approximated by the summation of the signals from eight subpatterns that are weighted by the above normalized coefficients and given phase adjustments as described in the following process.

In applying the above approach to a SCALPEL lithography system for detecting mask alignment error, the desired signal is generated through measurement of electrons backscattered through interaction of a substrate pattern with an incongruently-patterned energy source. By "incongruently patterned" it is meant that overlaying the energy pattern upon the substrate mark pattern results in noncoincidence of the two overall patterns for all positions along the substrate.

FIG. 4 illustrates a mark detection system for a SCALPEL lithography system. A series of marks 60 are formed on a substrate 70. Marks 60 are selected to generate backscattered electron contrast between the marks and the substrate background. The source of the contrast is either compositional or topographic. Compositional marks generate intensity contrast since the backscattering coefficient increases with atomic number causing the intensity of the backscattered electron signal to increase when an electron source scans a mark. For compositional contrast, marks 60 are fabricated from a high-backscatter electron material such as tungsten or gold while substrate 70 is fabricated from a low backscatter material such as silicon or GaAs (gallium arsenide).

Topographic marks generate intensity contrast due to the increase in the backscattering coefficient with an increase in the angle of the surface normal to the incident beam. Topographic marks also generate trajectory contrast since the backscattered electrons are highly directional. Exemplary topographic marks are V-shaped grooves etched in the surface of substrate 70.

An energy-shaping mask 90 is positioned between an electron source 100 and substrate 70. Mask 90 includes regions of low electron scattering 95 which shape the electron source into beamlets of electrons. After passing through projection lens 110 and back focal plane filter 120, the electron beamlets 105 impinge substrate 70. Beamlets 105 scan across substrate marks 60 in the $\epsilon$-direction using deflection optics either in combination with or by translating the mask and/or substrate.

An electron detector 80 is positioned adjacent substrate 70 to measure electrons backscattered by substrate marks 60. Substrate marks 60 are compositional contrast marks such as tungsten on silicon. Because substrate marks 60 have a higher backscatter coefficient than the surrounding substrate portions, backscattered electron intensity is greatest when a beamlet aligns with a mark feature.

Figure 6:
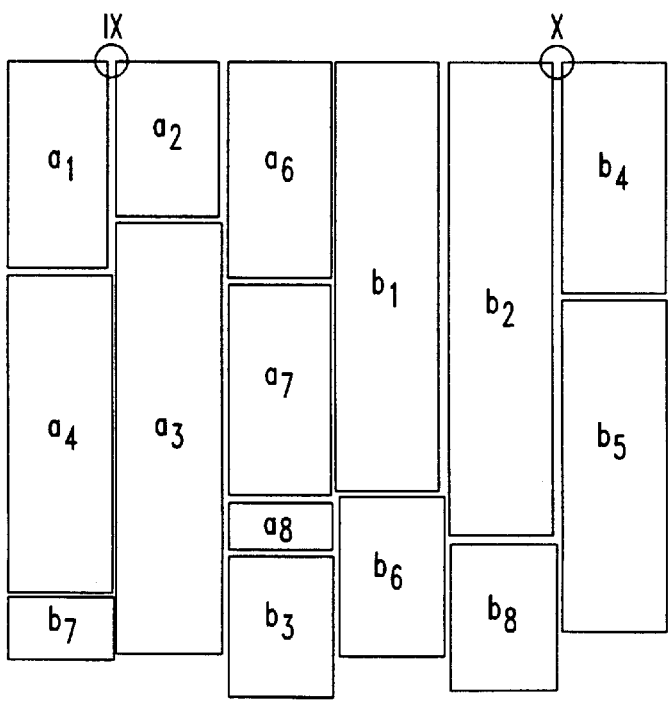
FIG. 6 schematically illustrates a substrate mark pattern showing subpatterns $a_1$–$a_8$ and $b_1$–$b_8$.

FIGS. 5 and 6 respectively illustrate the subpattern configuration of the mask pattern (after mask image demagnification) and substrate mark pattern constructed from the coefficients of the Fourier series expansion of the equation graphically depicted in FIG. 2. Each subpattern labelled $a_1$ through $a_8$ (no subpattern is created for $a_5$ since the value of this coefficient is approximately zero) or $b_1$ through $b_8$ represents the corresponding normalized coefficient listed in TABLE 2. Interaction of electrons from the electron source with the mask create beamlets (as in FIG. 4). These beamlets interact with the substrate marks to create a signal of backscattered electrons. The backscattered electron signal component generated by each substrate subpattern as the demagnified mask subpattern beamlets are scanned along the $\epsilon$-direction is equal to a waveform from that line and space subpattern multipled by the corresponding normalized coefficient (TABLE 2) times a factor that is a function of the backscatter ratio between the mark material and the substrate.

Figure 8:
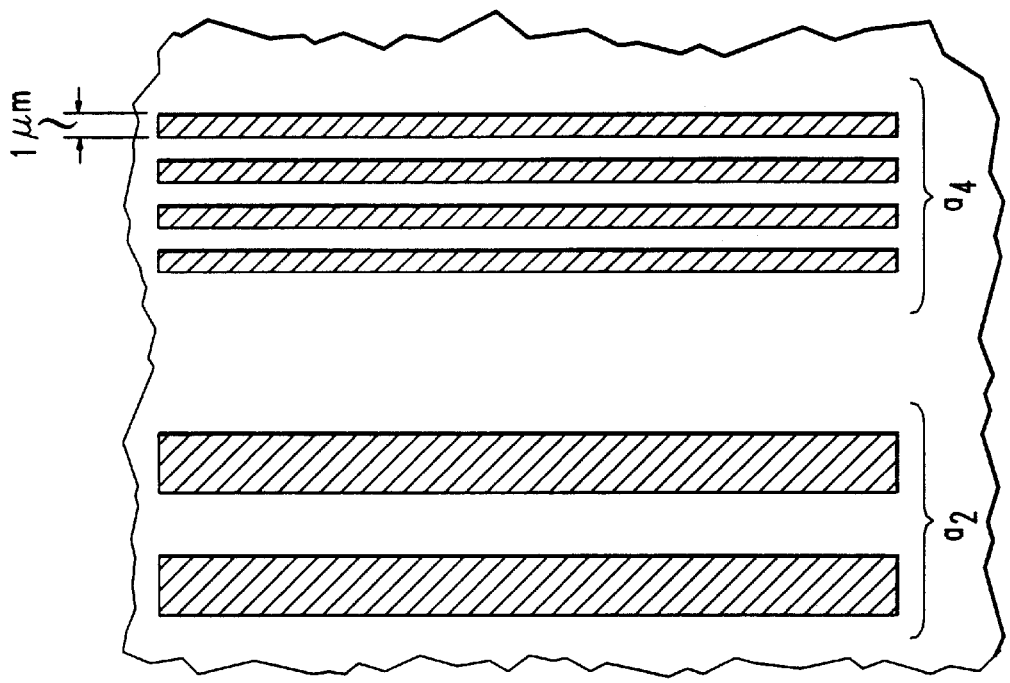
FIG. 8 is an enlarged portion of the mask pattern of FIG. 5 taken at VIII.
Figure 9:
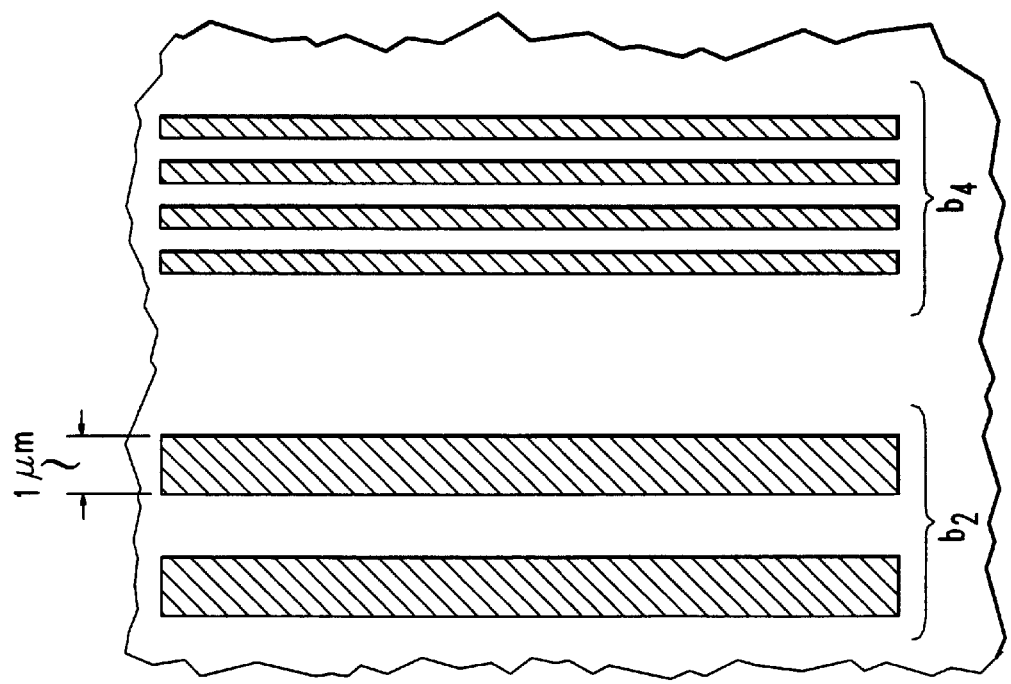
FIG. 9 is an enlarged portion of the substrate mark pattern of FIG. 6 taken at IX.
Figure 10:
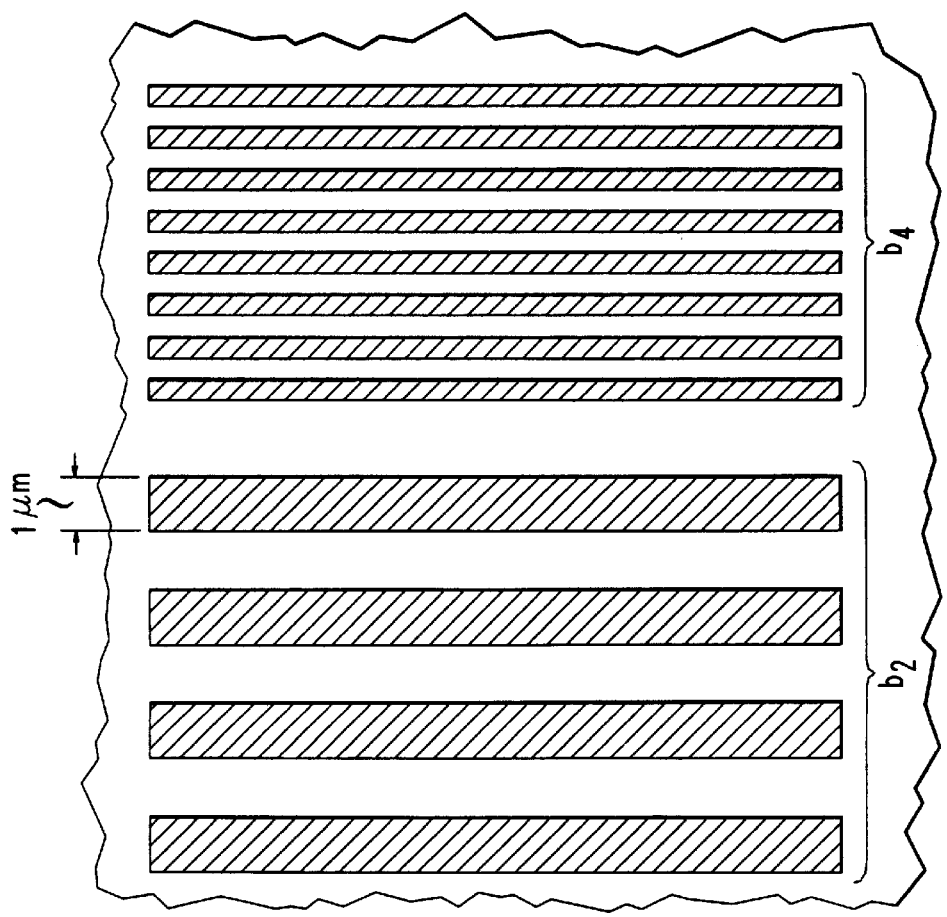
FIG. 10 is an enlarged portion of the substrate mark pattern of FIG. 6 taken at X.

FIG. 7 illustrates a portion of mask subpatterns $a_1$ and $a_2$ and FIG. 8 illustrates a portion of mask subpatterns $b_2$ and $b_4$. The corresponding substrate mark subpatterns $a_1$ and $a_2$ are illustrated in FIG. 9 with $b_2$ and $b_4$ shown in FIG. 10. Each subpattern comprises subpattern elements such as lines and spaces, the mask lines and spaces being regions of high and low electron scattering and the mark lines and spaces being regions of high and low electron backscatter coefficient material. It is appreciated by those skilled in the art that other geometric components can be employed for the subpattern elements. The magnitude of the coefficient, given in TABLE 2, denotes the total fractional area occupied by subpattern elements, i.e., the lines, relative to the total area occupied by the lines in all the subpatterns. Thus, the fractional area of the lines for the $a_1$ subpattern is 0.07742 of the total line area, the fractional area of the lines for the $a_2$ pattern is 0.03842 of the total line area, etc. The areas are also scaled to allow space between subpatterns.

It will be noted that the sign of some of the Fourier expansion coefficients is negative. Although the coefficients correspond to the total area occupied by the subpattern elements, a negative area cannot be constructed. Therefore, the energy-shaping mask subpattern and the substrate mark subpattern for a negative coefficient are constructed of subpattern elements having the same geometry and total area as those subpattern elements having a positive coefficient but positioned "out of phase" with respect to the function they modify. This positioning "out of phase" is due to the relationship that −cos(x) is equal to cos(180°+x), −sin(x) is equal to sin(180°+x), and cos(x)= sin(x+90°). This results in the overall mask pattern, viewed on the subpattern element level, being incongruent with the substrate mark pattern.

Figure 11:
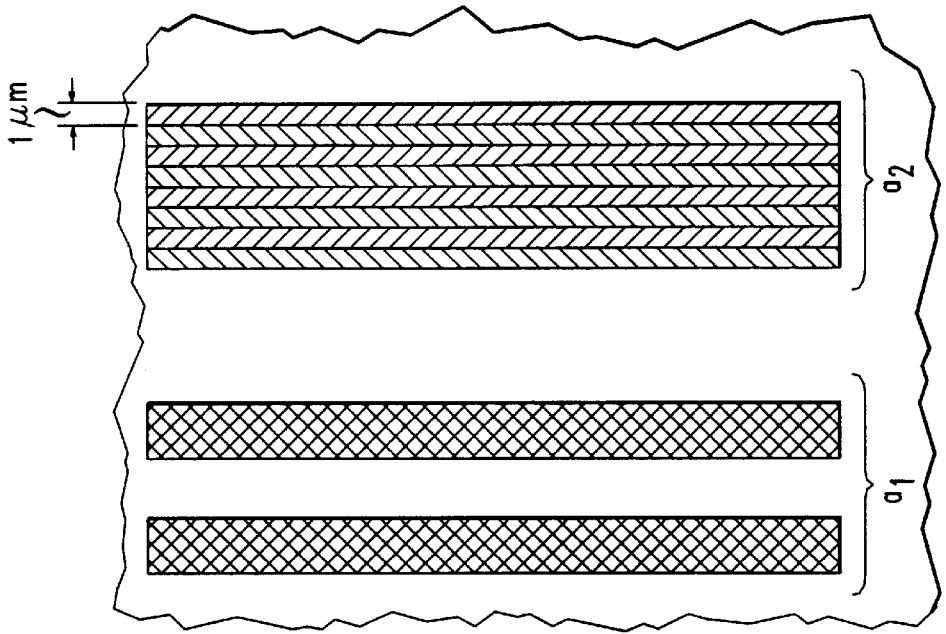
FIG. 11 depicts the superposition of the mask and substrate mark patterns of FIG. 7 and FIG. 9 at $\epsilon=0$.
Figure 12:
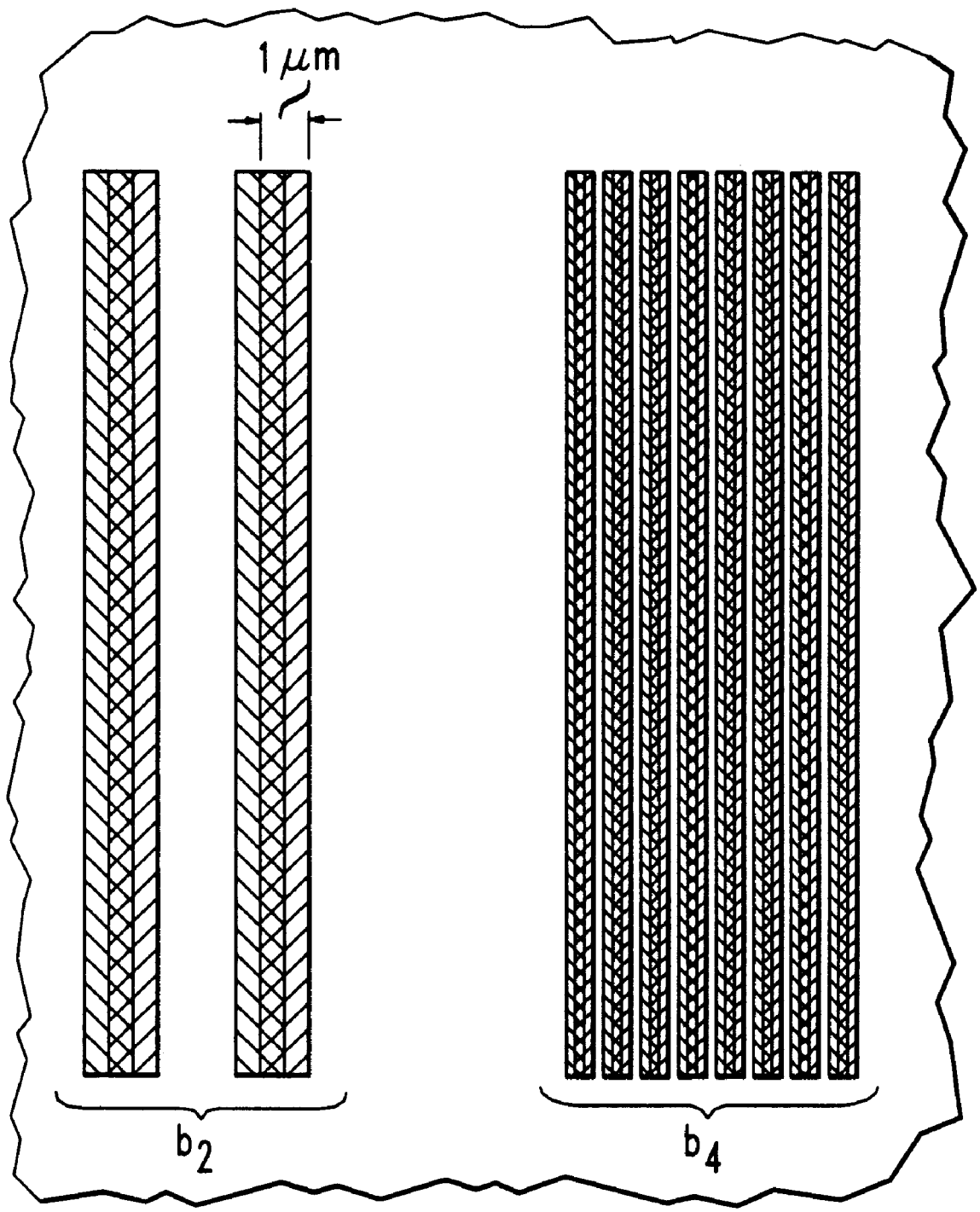
FIG. 12 depicts the superposition of the mask and substrate mark patterns of FIG. 8 and FIG. 10 at $\epsilon=0$.

This principle is illustrated in conjunction with FIGS. 11 and 12 in which energy shaped by mask subpattern $a_1$ and $a_2$ is respectively impinged upon substrate subpattern $a_1$ and $a_2$ (FIG. 11) and energy shaped by mask subpattern $b_2$ and $b_4$ is respectively impinged upon substrate subpattern $b_2$ and $b_4$ at the position $\epsilon=0$. Energy beamlets are created as the energy is shaped by the mask subpattern, as previously described. The location of the energy beamlets as they impinge upon the substrate mark pattern is indicated by dashed lines for $\epsilon=0$. The measured backscattered electron energy intensity for the a I subpattern will be at a maximum at $\epsilon=0$.

As seen in FIG. 11, the beamlets created by the $a_1$ mask subpattern align with the substrate mark subpattern a1 to create the maximum amount of backscattered electron intensity. Thus the sign of the $a_1$ coefficient is positive since the mask image subpattern is constructed to be "in phase" with the wafer mark subpattern. The measured backscattered electron intensity will correspond to the $a_1$ fractional total as given in TABLE 2.

The $b_n$ coefficient subpatterns at $\epsilon=0$ are at half of their maximum intensity. FIG. 12 illustrates the incidence of the shaped energy beam on mark subpattern regions $b_2$ and $b_4$. As seen in FIG. 12, the shaped energy beamlets are positioned with half of their area incident on the substrate marks. The sign of the $b_2$ coefficient is also positive since as $\epsilon$ is increased from zero the area of the energy shaped beamlet that overlaps the mark subpattern ($b_2$) increases.

However, examining the subpattern regions for which the coefficient signs are negative, i.e., $a_2$ in FIG. 11 and $b_4$ in FIG. 12, it is seen that these regions instead generate a backscattered intensity which is 180° out of phase with that generated by the $a_1$ and $b_2$ subpatterns, respectively. The negative sign of the $a_2$ coefficient is translated into shifting the $a_2$ mask and mark subpattern regions 180° out of phase with one another. This shifting causes the backscattered electron intensity at $\epsilon=0$ to be a minimum for $a_2$.

Turning to subpattern region $b_4$ in FIG. 12, it is seen that the position of the beamlets created by the $b_4$ mask subpattern regions incident on the $b_4$ substrate subpattern regions are shifted by 180° with respect to $b_2$. This compensates for the negative sign of the $b_4$ coefficient.

In this fashion, the approximation of the function of FIG. 2 is created by the measured backscattered electron intensities from the interactions of the shaped energy source with a substrate mark pattern. The approximation is given by the summation of signal subpatterns with the appropriate phases as described above. The signal generated from the measured backscattered electron intensities is illustrated in FIG. 3 superposed upon the ideal function of FIG. 2.

While the error detection system for the present system has been described above using the electron scattering principles of a SCALPEL lithography system, other particle beams or forms electromagnetic radiation are exemplary energy sources. When using a different particle beam, such as an ion beam, or electromagnetic radiation, the mask pattern can be formed as apertures to create transmissive and absorptive regions in the mask. For ion beams, the detected radiation can be secondary electrons from the marks caused by the impinging ion beam. For electromagnetic radiation, reflected radiation from the alignment marks can be detected, e.g., through use of a suitable detector such as a photodiode or other suitable light sensitive detectors.

Once a signal has been measured by the error detection system of the present invention, standard signal processing and feedback control circuitry may be used to correct the source of the system error. The measured signal is compared to a reference signal to generate an error signal proportional to the magnitude of the error in the system. The error signal is then input to a controller for regulating the source of the error. For alignment error, the error signal is input to a position controlling member for movement of the substrate or other workpiece into proper alignment or to shift the position of the shaped energy source using electromagnetic or electrostatic deflection.

In use, the error detection system of the present invention can be used in a SCALPEL lithography system for electronic device fabrication. In such a system, schematically illustrated in FIG. 1, lithographic delineation is performed following use of the error detection system of the present invention to eliminate any errors in alignment, magnification, focus, astigmatism, and the like. An electron beam, suitably shaped by a mask, projects an image onto a substrate, e.g., by exposing a photoresist to form a latent image in the photoresist. The latent image is developed, typically by removing the exposed or unexposed portions of the photoresist. The developed image is then used in further substrate processing, e.g., to mask underlying regions from etching or ion implantation, wafer oxidation, and other known semiconductor processing steps.

While the foregoing invention has been described with respect to the above embodiments, various changes and modifications may be made without departing from the scope and spirit thereof. Accordingly, such changes and modifications are considered to be within the scope of the invention.

I claim:

1. A method for determining error in a manufacturing system comprising:

providing a substrate having at least a first pattern disposed thereon;

providing an energy source selected from electromagnetic radiation and particle beams;

projecting the energy source through a shaping member having a second pattern, the second pattern being incongruent to the first pattern, said projecting of said energy source through said shaping member having said second pattern defining beams of said electromagnetic radiation having the same geometry as said first pattern, to form a shaped energy source;

scanning the shaped energy source onto the first pattern such that a portion of the shaped energy source is reflected, scattered, transmitted, or absorbed by the first pattern and such that said scanning together with said first pattern causes said portion that is reflected, scattered, transmitted, or absorbed to be a linear combination of at least three orthogonal functions.

2. A method for determining error in a manufacturing system according to claim 1 wherein the first pattern correlates to coefficients generated by expanding a mathematical function representing a waveform in a set of orthogonal functions.

3. A method for determining error in a manufacturing system according to claim 2 wherein the second pattern correlates to coefficients generated by expanding a mathematical function representing a waveform in a set of orthogonal functions.

4. A method for determining error in a manufacturing system according to claim 3 wherein the orthogonal functions are sines and cosines and the expanding is performed using Fourier series.

5. A method for determining system errors in a projection electron lithography system comprising:

projecting an electron beam through a mask having a first pattern comprising electron-scattering regions and electron-transmissive regions to create a shaped electron beam;

projecting and scanning said shaped electron beam on a substrate having a second pattern, said second pattern being incongruent to said first pattern, said second pattern comprising regions that reflect, scatter, transmit or absorb electrons such that said scanning causes said energy reflected, scattered, transmitted or absorbed by said second pattern to be a linear combination of at least three orthogonal functions;

detecting electrons scattered by said second pattern to determine the alignment of said mask and said substrate.

6. A method for determining system errors in a projection electron lithography system according to claim 5 wherein the first pattern correlates to coefficients generated by expanding a mathematical function representing a waveform in a set of orthogonal functions.

7. A method for determining system errors in a projection electron lithography system according to claim 6 wherein the second pattern correlates to coefficients generated by expanding a mathematical function representing a waveform in a set of orthogonal functions.

8. A method for determining system errors in a projection electron lithography system according to claim 7 wherein the orthogonal functions are sines and cosines and the expanding is performed using Fourier series.

9. The method of claim 5 wherein the projection electron lithography system is a SCALPEL system.

10. A method comprising at least one step of lithographically delineating an image, said step comprising projecting a beam of particles on a substrate to form an image thereon, developing the image, and using the image in further substrate processing, characterized in that said step of lithographically delineating an image comprises projecting an electron beam through a mask image having a first pattern comprising two type regions that scatter electrons to different degrees to create a shaped electron beam;

projecting and scanning said shaped electron beam on a substrate having a second pattern, said second pattern, being incongruent to said first pattern, said second pattern comprising regions that scatter electrons such that said electrons scattered from said second pattern is a linear combination of orthogonal functions;

detecting electrons scattered by said second pattern to determine the presence of a lithography system error; and correcting a lithography system error.

11. A method for determining error in a manufacturing system comprising:

providing a substrate having at least first pattern disposed thereon;

providing an energy source selected from electromagnetic radiation and particle beams;

projecting the energy source through a shaping member having a second pattern, the second pattern being incongruent to the first pattern, to form a shaped energy source;

scanning the shaped energy source onto the first pattern such that a portion of the shaped energy source is reflected, scatter, transmitted, or absorbed by the first pattern such that said portion that is reflected, scattered, transmitted, or absorbed is a linear combination of at least 3 orthogonal functions;

detecting the portion of the shaped energy source that is reflected, scattered, absorbed or transmitted by the first pattern to determine the presence of a manufacturing system error.

12. A method comprising at least one step of lithographically delineating an image, said step comprising projecting a beam of particles on a substrate to form an image thereon, developing the image, and using the image in further substrate processing, characterized in that said step of lithographically delineating an image comprises projecting an electron beam through a mask image having a first pattern comprising electron-scattering regions and electron-transmissive regions to create a shaped electron beam;

scanning said shaped electron beam on a substrate having a second pattern, said second pattern being incongruent to said first pattern, said second pattern comprising regions having differing electron scattering properties;

detecting electrons scattered by said second pattern to determine the presence of lithography system error whereby said detected electrons represent a linear combination of at least 3 orthogonal functions; and correcting a lithography system error.

* * * * *